US012000895B2

(12) United States Patent
Simonis et al.

(10) Patent No.: US 12,000,895 B2
(45) Date of Patent: Jun. 4, 2024

(54) METHOD FOR PREDICTING AN AGING STATE OF A BATTERY

(71) Applicant: Robert Bosch GmbH, Stuttgart (DE)

(72) Inventors: Christian Simonis, Leonberg (DE); Christoph Woll, Gerlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 234 days.

(21) Appl. No.: 17/630,087

(22) PCT Filed: Oct. 29, 2020

(86) PCT No.: PCT/EP2020/080344

§ 371 (c)(1),
(2) Date: Jan. 25, 2022

(87) PCT Pub. No.: WO2021/089391

PCT Pub. Date: May 14, 2021

(65) Prior Publication Data

US 2022/0252671 A1 Aug. 11, 2022

(30) Foreign Application Priority Data

Nov. 8, 2019 (DE) ..................... 10 2019 217 299.7

(51) Int. Cl.
*G01R 31/367* (2019.01)
*G01R 31/392* (2019.01)
*G07C 5/10* (2006.01)

(52) U.S. Cl.
CPC ......... *G01R 31/367* (2019.01); *G01R 31/392* (2019.01); *G07C 5/10* (2013.01)

(58) Field of Classification Search
None
See application file for complete search history.

(56) References Cited

U.S. PATENT DOCUMENTS

2013/0148283 A1* 6/2013 Forutanpour ............ H04Q 9/00 324/426
2013/0262067 A1* 10/2013 Zhang ................. G05B 23/024 703/8
2018/0188332 A1 7/2018 Newman et al.
2019/0130332 A1* 5/2019 Janssen ................ G01R 31/382
2020/0284846 A1* 9/2020 Pajovic ................ G01R 31/396
(Continued)

FOREIGN PATENT DOCUMENTS

DE 102009042656 A1 3/2011
DE 102011080638 A1 2/2013
DE 102014200645 A1 7/2015
(Continued)

OTHER PUBLICATIONS

International Search Report for PCT/EP2020/080344 Issued Jan. 28, 2021.

*Primary Examiner* — Jas A Sanghera
(74) *Attorney, Agent, or Firm* — NORTON ROSE FULBRIGHT US LLP; Gerard A. Messina

(57) ABSTRACT

A method for predicting an aging state of a battery. A vehicle is also provided that includes at least one battery, the aging state of which is predited using the method and/or the aging behavior of which is improved based on the aging state prediction. A prediction system that is configured to carry out the method is also provided.

13 Claims, 2 Drawing Sheets

200
memory device
data-driven fleet model
242
240
260
210
fusion model
preprocessing model
load prediction model
250
220
battery reference model
230

(56) References Cited

U.S. PATENT DOCUMENTS

2020/0292624 A1* 9/2020 Tajima ................. G01R 31/387

FOREIGN PATENT DOCUMENTS

| | | | |
|---|---|---|---|
| DE | 102015001050 | A1 | 8/2016 |
| DE | 102016224548 | A1 | 6/2018 |
| DE | 102017103617 | A1 | 8/2018 |
| DE | 102018204848 | A1 | 10/2019 |
| EP | 1129343 | A1 | 9/2001 |
| EP | 3203574 | A1 | 8/2017 |
| WO | 2019017991 | A1 | 1/2019 |
| WO | 2019199219 | A1 | 10/2019 |

* cited by examiner

METHOD FOR PREDICTING AN AGING STATE OF A BATTERY

FIELD

The present invention relates to a method for predicting an aging state of a battery. The present invention further relates to a vehicle that includes at least one battery, the aging state of which is predicted using the method according to the present invention and/or the aging behavior of which is improved based on the aging state predicted using the method according to the present invention. The present invention further relates to a prediction system that is configured to carry out the method according to the present invention.

BACKGROUND INFORMATION

An aging state (state of health (SOH)) of a battery is a function of various influencing factors. These include, for example, current throughput through the battery, number and depth of charging and discharging cycles of the battery, maximum charging current and discharging current of the battery, thermal circuits for the battery, operating temperature of the battery, state of charge (SOC) of the battery, etc. Since all these factors, in a different form and weighting, determine the SOH value in a battery that is generally operated individually, it is difficult to accurately determine this value.

PCT Patent Application No. WO 2019/017991 A1 describes a battery management system for a motor vehicle, containing a module for estimating states of a rechargeable battery.

SUMMARY

In accordance with the present invention, a method for predicting an aging state of a battery is provided.

The battery is preferably designed as a lithium-ion battery, and includes multiple battery cells that are connected to one another in series or in parallel.

In accordance with an example embodiment of the present invention, first, data of the battery are provided as a function of various usage profiles of the battery. The data of the battery include, for example, a voltage pattern of the battery, a current pattern of the battery, and an operating temperature pattern of the battery. Of course, the data may also include battery-characterizing variables. The battery-characterizing variables of the battery include, for example, temperature, charging currents, energy throughput, state of charge, and combinations of states, such as a high state of charge at elevated temperature for an extended period. The battery-characterizing variables of the battery also include chemical data of the battery. A usage profile is understood in particular to mean load profiles and charging profiles of the battery.

The data of the battery are subsequently transmitted to a memory device. Data from multiple comparison batteries are stored in the memory device. Aging state values and/or aging state patterns of the comparison batteries are also stored in the memory device, preferably as a function of usage profiles of the particular comparison battery. The memory device may be associated with a data-driven fleet model. The memory device preferably includes the data-driven fleet model. The data stored in the memory device are processed and analyzed with the aid of the data-driven fleet model.

Aging state values of the battery are subsequently determined at defined times and/or for defined events with the aid of a battery reference model. The battery reference model includes relationships between the data of the battery, the aging state value of the battery, and the usage profiles of the battery. Prior to determining the aging state values, signals or signal patterns of the battery are preferably prepared with the aid of a preprocessing model.

When the battery-characterizing variables of the battery, such as the label, which is a measured aging state reference for machine learning, are known, an aging state value may be directly and precisely calculated with the aid of the battery reference model. If a label is present, the battery reference model is executed as an artificial intelligence-based model. If no label is present, the battery reference model corresponds to the value that is calculated in a vehicle control unit, for example.

In the case that the battery-characterizing variables of the battery are unknown, an aging state value of the battery may be calculated with the aid of a battery management system, for example. This aging state value calculated by the battery management system is then used as a base value for the battery reference model, and is set in correlation with battery-characterizing variables of the battery, which are an indicator for a degree of aging of the battery.

An aging state pattern of the battery is subsequently formed based on the determined aging state values of the battery.

A predicted aging state value and/or a predicted aging state pattern of the battery are/is subsequently determined. The predicted aging state value and/or the predicted aging state pattern of the battery may be determined by extrapolating the aging state pattern that is formed.

The predicted aging state value and/or the predicted aging state pattern may also be determined by associating the formed aging state pattern with an ascertained aging state pattern from the data of the comparison battery stored in the memory device, multiple aging state patterns being ascertained from the data of the comparison batteries stored in the memory device. The ascertainment may be carried out by clustering (for example, nearest neighbor heuristics or a k-means algorithm) for ascertaining loads of the battery with regard to aging state patterns of different usage profiles.

The extrapolation and the association of the formed aging state pattern may be used together to determine the predicted aging state value and/or the predicted aging state pattern.

In accordance with an example embodiment of the present invention, a load prediction of the battery is preferably carried out. The load prediction may be performed, for example, based on predictive route data of a vehicle, navigation data of the vehicle, and further information from a control unit of the vehicle. The predictive route data may be determined using car-to-X communication, in particular car-to-car communication. Car-to-X/car-to-car communication refers to an exchange of information and data between vehicles and the surroundings/vehicles, with the aim of providing early notification to the driver of critical and hazardous situations.

The predicted aging state value and/or the predicted aging state pattern of the battery are/is preferably compared to an actual aging state value and/or an actual aging state pattern of the battery from the actual aging state values determined by the battery reference model. The predicted aging state value and/or the predicted aging state pattern of the battery may also be compared to a stored aging state value and/or a stored aging state pattern of the comparison batteries from the memory device, which on the one hand extrapolates the individual aging state pattern of the particular comparison batteries, and on the other hand predicts confidence intervals for the aging state value by statistical distribution of the comparison batteries. Both comparisons are preferably carried out.

The battery reference model is preferably designed as an artificial intelligence-based model. However, it is also possible for the battery reference model to be designed as a physical model, a metamodel, or a data model, which may be a characteristic map of the battery. Of course, a plurality of the above-mentioned models may be used to form the battery reference model.

The battery reference model is preferably compared based on the data of the comparison batteries stored in the memory device. In the case that the battery-characterizing variables of the battery are unknown, the battery reference model may be parameterized based on the aging state value of the battery that is calculated by the battery management system and used as a base value for the battery reference model, and based on the data of the comparison batteries stored in the memory device.

The aging state values of the battery are preferably determined for various prediction horizons.

A prediction horizon is understood to mean, for example, a certain time period in conjunction with a certain minimum number of driving cycles of a vehicle. Calendrical and cyclic aging of the battery under current load and temperature load are thus likewise taken into account. In particular short-term predicted aging state values such as 2 weeks and/or 10 driving cycles, in contrast to medium-term predicted aging state values such as 4 weeks and/or 20 driving cycles, and long-term predicted aging state values such as 8 weeks and/or 40 driving cycles, take into account very different driving modes, which may occur with a change of drivers or a change of owners of a vehicle, for example. As a result, the prediction accuracy is significantly higher.

The data of the battery are preferably transmitted to the memory device with the aid of a wireless network. The wireless network may be designed as a WLAN network. The wireless network is preferably designed as a mobile radio communications network, for example a UMTS network or LTE network.

The memory device is preferably designed as a cloud memory. However, it is also possible for the memory device to be designed as a memory medium, such as a memory of a control unit of the battery, or an external memory.

The data of the battery that are transmitted to the memory device are preferably continuously monitored and assessed.

The data of the battery and of the particular comparison battery stored in the memory device are preferably continuously verified and assessed.

The monitoring, assessment, and verification of the data transmitted to the memory device and of the data stored in the memory device are preferably carried out with the aid of an artificial intelligence-based model.

When deviations occur between the predicted and the actual aging state value at the time of prediction, an adaptation is always made to the actual value that is determined by the battery reference model, and taken into account for the future prediction. A possible systematic deviation is incorporated into the further predicted aging state pattern and corrected, so that the prediction residuals are normally distributed.

Based on the predicted aging state value or the predicted aging state pattern, an operating strategy for the battery is preferably applied which pursues an objective of counteracting the aging behavior of the battery and thus prolonging the service life of the battery. This may be achieved by transferring the battery into a gentle operating state, for example via changed performance limits, charging behavior, operating temperature, or the like. The battery may thus leave an originally poor aging state pattern and pass to a better aging state pattern.

If the mid- or long-term aging state value of the battery indicates pronounced deterioration, a gradual decrease in the aging state value may be achieved by changing the operating strategy. Effective measures, passive as well as active, refer, for example, to a reduction in current, temperature control, or a recommendation for avoiding quick-charging cycles, or the like. A strategy adaptation may also use further batteries, which are connected to the memory device and have a similar aging state pattern, as a default for their aging state-optimal behavior. In addition, the aging state value may decrease more moderately, and pass to a different aging state pattern without intervention into the operating strategy, via load changes, for example by more driving in urban traffic or on open highways, or by changing the charging behavior. Prolonging the service life of the battery is ensured by these measures.

Conversely, in the case that the battery is not operated under optimal conditions, which results in progressive aging, by changing the operating strategy it is also possible that higher power or more deep discharge cycles, individual quick-charging operations of the battery, or the like may offer advantages with regard to the aging behavior of the battery.

Furthermore, in accordance with an example embodiment of the present invention, a vehicle is provided which includes at least one battery, the aging state of which is predicted using the method according to the present invention and/or the aging behavior of which is improved based on the aging state predicted using the method according to the present invention.

Further information or parameters of the vehicle, such as a usage profile of the vehicle and the driving style of a driver, may likewise be transmitted to the memory device.

In addition, in accordance with an example embodiment of the present invention, a prediction system is provided, which is configured to carry out the method according to the present invention for predicting an aging state of a battery.

The prediction system may have a battery reference model, a memory device that includes a data-driven model, and a fusion model, for example. The battery reference model characterizes the underlying battery technology. The data-driven model heuristically describes the actual behavior of comparison batteries with regard to aging of the battery. The fusion model combines both approaches into a highly accurate aging state calculation of the battery and prediction. The fusion model is preferably designed as an artificial intelligence-based model. The prediction system may also include a preprocessing model for signal preparation, and a load prediction model for predicting loads of the battery.

The method according to example embodiment of the present invention may make it possible to determine aging without taking into account the individual aging state dependencies.

Using the method according to the present invention, it is not necessary to adapt software in a battery management system for determining an aging state and a prediction.

In addition, the battery reference model may be compared to the data from the memory device, thus improving the accuracy of the predicted aging state value.

Via short-term forecasting, the method according to the present invention advantageously allows a rapid response to changed load behavior of the battery, for example with regard to a systematic change in the use behavior or anomaly detection.

By use of the method according to the present invention, an operating strategy of the battery that results in prolonging the battery service life and/or increasing performance may be applied.

Using the method according to the present invention, changes in load and charging behavior of the battery may advantageously be automatically detected, so that an intervention into the operating strategy may not be necessary.

By use of the method according to the present invention, contributors to aging of the battery which are not apparent may be analyzed, modeled, and verified across vehicles in a memory device, for example using "big data" methods and artificial intelligence, and may subsequently be directly used for predicting an aging state of the battery. The prediction of the aging state is thus also enhanced by additional information from the memory device, which further improves the accuracy of the aging prediction.

For unknown batteries for which no battery-characterizing variables of the battery are present, large data volumes may be analyzed, modeled, and verified across vehicles in the memory device by use of artificial intelligence. By use of newly ascertained interrelationships, new product generations and/or software updates may be continually optimized via the findings from the memory device.

Furthermore, by use of the method according to the present invention, an online-verified battery reference model may be derived for the unknown batteries, based on the data stored in the memory device.

BRIEF DESCRIPTION OF THE DRAWINGS

Specific embodiments of the present invention are explained in greater detail based on the figures and the following description.

DETAILED DESCRIPTION OF EXAMPLE EMBODIMENTS

Figure 1:
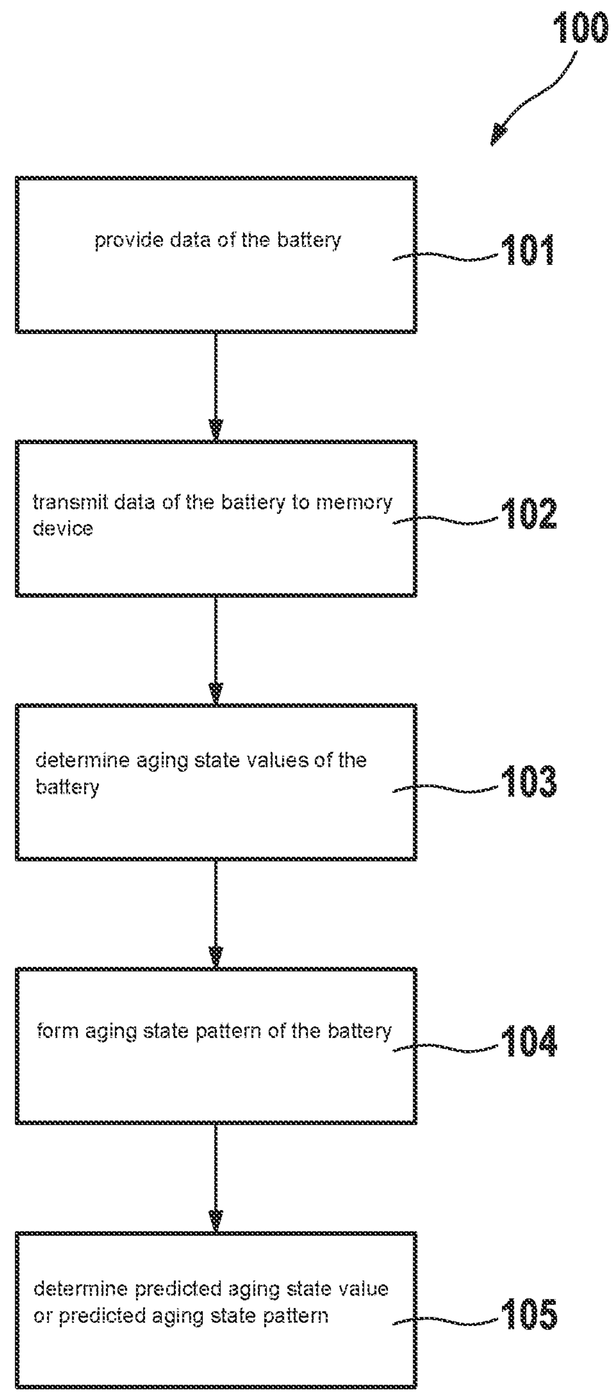
FIG. 1 shows a flow chart of the method according to an example embodiment of the present invention for predicting an aging state of a battery.

In the following description of the specific embodiments of the present invention, identical or similar elements are denoted by the same reference numerals, and a repeated description of these elements is dispensed with in individual cases. The figures illustrate the subject matter of the present invention in only a schematic fashion.

FIG. 1 shows a flow chart 100 of the method according to the present invention for predicting an aging state of a battery.

Data of the battery are provided in a first step 101 as a function of various usage profiles of the battery. The data of the battery include, for example, a voltage pattern of the battery, a current pattern of the battery, and an operating temperature pattern of the battery. Of course, the data may also include battery-characterizing variables. A usage profile is understood in particular to mean load profiles and charging profiles of the battery.

The data of the battery are transmitted to a memory device 240 (see FIG. 2) in a second step 102. Data from multiple comparison batteries are stored in memory device 240. Aging state values and/or aging state patterns of the comparison batteries are also stored in memory device 240, preferably as a function of usage profiles of the particular comparison battery. Memory device 240 may be associated with a data-driven fleet model 242 (see FIG. 2). Memory device 240 preferably includes data-driven fleet model 242. The data stored in memory device 240 are processed and analyzed with the aid of data-driven fleet model 242.

Figure 2:
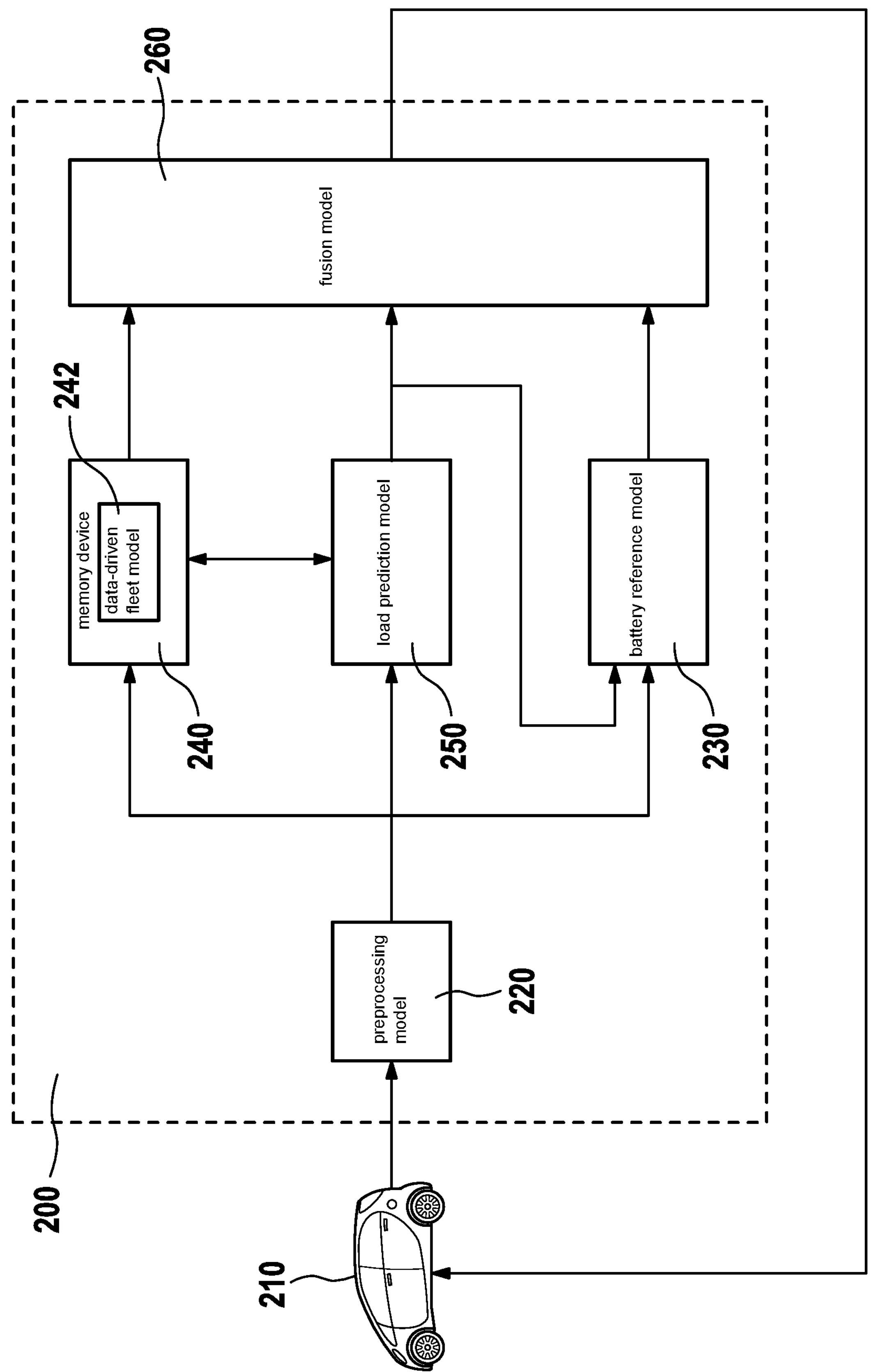
FIG. 2 shows a schematic illustration of a prediction system for carrying out the method according to an example embodiment of the present invention.

Aging state values of the battery are determined at defined times and/or for defined events in a third step 103 with the aid of a battery reference model 230 (see FIG. 2). Battery reference model 230 includes relationships between the data of the battery, the aging state value of the battery, and the usage profiles of the battery. Prior to determining the aging state values, signals or signal patterns of the battery are preferably prepared with the aid of a preprocessing model 220 (see FIG. 2).

When the battery-characterizing variables of the battery are known, an aging state value may be directly and precisely calculated with the aid of battery reference model 230.

In the case that the battery-characterizing variables of the battery are unknown, an aging state value of the battery may be calculated with the aid of a battery management system, for example. This aging state value calculated by the battery management system is then used as a base value for battery reference model 230, and is set in correlation with battery-characterizing variables of the battery, which are an indicator for a degree of aging of the battery.

An aging state pattern of the battery is formed in a fourth step 104, based on the determined aging state values of the battery.

A predicted aging state value and/or a predicted aging state pattern of the battery are/is determined in a fifth step 105. The predicted aging state value and/or the predicted aging state pattern of the battery may be determined by extrapolating the aging state pattern that is formed.

The predicted aging state value and/or the predicted aging state pattern may also be determined by associating the formed aging state pattern with an ascertained aging state pattern from the data of the comparison battery stored in memory device 240, multiple aging state patterns being ascertained from the data of the comparison batteries stored in memory device 240. The ascertainment may be carried out by clustering (for example, nearest neighbor heuristics or a k-means algorithm) for ascertaining loads of the battery with regard to aging state patterns of different usage profiles.

The extrapolation and the association of the formed aging state pattern may be used together to determine the predicted aging state value and/or the predicted aging state pattern.

FIG. 2 shows a schematic illustration of a prediction system 200 that is configured to carry out the method according to the present invention.

Prediction system 200 includes a preprocessing model 220, a battery reference model 230, a memory device 240 that includes a data-driven fleet model 242, a load prediction model 250, and a fusion model 260.

First, data of a battery (not illustrated) of a vehicle 210 are provided as a function of various usage profiles of the battery, and all signals of vehicle 210 are provided. The data of the battery include, for example, a voltage pattern of the battery, a current pattern of the battery, and an operating temperature pattern of the battery. Of course, the data may also include battery-characterizing variables. A usage profile is understood in particular to mean load profiles and charging profiles of the battery.

The signals of the battery and of vehicle 210 are prepared for further use by preprocessing model 220. The prepared signals are then transmitted to battery reference model 230, to memory device 240, and to load prediction model 250.

Data from multiple comparison batteries are stored in memory device 240. Aging state values and/or aging state patterns of the comparison batteries are also stored in memory device 240, preferably as a function of usage profiles of the particular comparison battery. Signals or information from other vehicles are likewise stored in memory device 240. The data stored in memory device 240 are processed and analyzed with the aid of data-driven fleet model 242.

For example, a load of the battery may be predicted with the aid of load prediction model 250. The load prediction may be performed, for example, based on predictive route data of vehicle 210, navigation data of vehicle 210, and further information from a control unit of vehicle 210. The predictive route data may be determined using communication, for example car-to-X/car-to-car communication, and transmitted between load prediction model 250 and memory device 240.

Based on the data of the battery, aging state values of the battery are determined at defined times and/or for defined events with the aid of battery reference model 230. Battery reference model 230 includes relationships between the data of the battery, the aging state value of the battery, and the usage profiles of the battery. The result of load prediction model 250 is also taken into account in determining the aging state values of the battery.

The aging state values determined by battery reference model 230, the result from load prediction model 250, and the data stored in memory device 240 are transmitted to fusion model 260. Fusion model 260 is designed as an artificial intelligence-based model. An aging state of the battery is predicted with the aid of fusion model 260.

By use of fusion model 260, battery reference model 230 is compared based on the data of the comparison batteries stored in memory device 240. Fusion model 260 thus unites the model-based aging state calculation and prediction of battery reference model 230, and the data-driven aging state calculation and prediction of data-driven fleet model 242.

Based on the predicted aging state of the battery, with the aid of fusion model 260 an operating strategy for the battery or vehicle 210 is developed which pursues an objective of counteracting the aging behavior of the battery and thus prolonging the service life of the battery. This may be achieved by transferring the battery into a gentle operating state, for example via changed performance limits, charging behavior, operating temperature, or the like. By way of the operating strategy, the battery may thus leave an originally poor aging state pattern and pass to a better aging state pattern.

The present invention is not limited to the exemplary embodiments described here and the aspects highlighted therein. Rather, numerous modifications are possible within the scope of activities carried out by those skilled in the art, in view of the disclosure herein.

What is claimed is:

1. A method for predicting an aging state of a battery, the method comprising:

providing data of the battery as a function of various usage profiles of the battery;

transmitting the data of the battery to a memory device in which data from multiple comparison batteries are stored, processed, and analyzed;

determining aging state values of the battery at defined times and/or for defined events using a battery reference model;

forming an aging state pattern of the battery based on the determined aging state values; and determining a predicted aging state value and/or a predicted aging state pattern of the battery: (i) by extrapolating the aging state pattern that is formed, and (ii) by associating the formed aging state pattern with an ascertained aging state pattern from the data of the comparison batteries stored in the memory device, multiple aging state patterns being ascertained from the data stored in the memory device.

2. The method as recited in claim 1, wherein the battery reference model is an artificial intelligence-based model.

3. The method as recited in claim 1, wherein the battery reference model is compared based on the data of the comparison batteries stored in the memory device.

4. The method as recited in claim 1, wherein the aging state values of the battery are determined for various prediction horizons.

5. The method as recited in claim 1, wherein the data of the battery are transmitted to the memory device using a wireless network.

6. The method as recited in claim 1, wherein the memory device is a cloud memory.

7. The method as recited in claim 1, wherein the data of the battery transmitted to the memory device are continuously monitored and assessed.

8. The method as recited in claim 1, wherein the data of the battery and of the comparison batteries stored in the memory device are continuously verified and assessed.

9. The method as recited in claim 1, wherein a load pattern is learned individually by a driver based on historical loads and utility patterns, and is then parameterized as a load prediction, including a current profile or a temperature profile.

10. The method as recited in claim 9, wherein the load prediction is input to the reference model to obtain a model-based SOH prediction, wherein the SOH prediction in the fusion module is merged with another SOH prediction from a data-driven fleet model.

11. The method as recited in claim 10, wherein there is a weighting of the two predictions, so as to provide a merged prediction.

12. A vehicle, comprising:

a device; and at least one battery, wherein an aging state of which is predicted and/or an aging behavior of which is improved based on the predicted aging state, wherein the aging state is predicted by the device;

wherein the device is configured to perform the following:

providing data of the battery as a function of various usage profiles of the battery;

transmitting the data of the battery to a memory device in which data from multiple comparison batteries are stored, processed, and analyzed;

determining aging state values of the battery at defined times and/or for defined events using a battery reference model;

forming an aging state pattern of the battery based on the determined aging state values; and determining a predicted aging state value and/or a predicted aging state pattern of the battery: (i) by extrapolating the aging state pattern that is formed, and (ii) by associating the formed aging state pattern with an ascertained aging state pattern from the data of the comparison batteries stored in the memory device, multiple aging state patterns being ascertained from the data stored in the memory device.

13. A prediction apparatus to predict an aging state of a battery, comprising:

a prediction system configured to perform the following:

providing data of the battery as a function of various usage profiles of the battery;

transmitting the data of the battery to a memory device in which data from multiple comparison batteries are stored, processed, and analyzed;

determining aging state values of the battery at defined times and/or for defined events using a battery reference model;

forming an aging state pattern of the battery based on the determined aging state values; and determining a predicted aging state value and/or a predicted aging state pattern of the battery: (i) by extrapolating the aging state pattern that is formed, and (ii) by associating the formed aging state pattern with an ascertained aging state pattern from the data of the comparison batteries stored in the memory device, multiple aging state patterns being ascertained from the data stored in the memory device.

* * * * *